United States Patent [19]

Kohle et al.

[11] Patent Number: 4,881,320

[45] Date of Patent: Nov. 21, 1989

[54] METHOD OF MAKING VENTED SEAL FOR ELECTRONIC COMPONENTS AND AN ENVIRONMENTALLY PROTECTED COMPONENT

[75] Inventors: Michael R. Kohle, Atascadero; Durward H. Priebe, Paso Robles, both of Calif.

[73] Assignee: CTS Corporation, Elkhart, Ind.

[21] Appl. No.: 112,615

[22] Filed: Oct. 26, 1987

[51] Int. Cl.$^4$ .......................... H05K 3/30; G01L 7/00
[52] U.S. Cl. ..................................... 29/841; 29/592.1; 73/706; 73/727; 156/303.1
[58] Field of Search ............. 174/52 FP; 29/841, 582; 357/74; 200/302.2, 302.3; 73/706, 708, 727; 156/303.1

[56] References Cited

U.S. PATENT DOCUMENTS

| | | | |
|---|---|---|---|
| 3,246,112 | 4/1966 | Adams et al. | 200/302.2 |
| 3,928,742 | 12/1975 | Rule | 200/302.3 |
| 4,018,999 | 4/1977 | Robinson et al. | 200/302.2 X |
| 4,074,088 | 2/1978 | Keough et al. | 200/302.2 X |
| 4,362,910 | 12/1982 | Boebel et al. | 200/302.2 X |
| 4,398,074 | 8/1983 | Danielson et al. | 200/302.2 |
| 4,568,807 | 2/1986 | Piber | 200/302.2 |
| 4,663,227 | 5/1987 | Yamamori et al. | |
| 4,686,764 | 8/1987 | Adams et al. | 73/706 X |
| 4,732,042 | 3/1988 | Adams | 73/706 |

Primary Examiner—Carl J. Arbes
Attorney, Agent, or Firm—Albert W. Watkins

[57] ABSTRACT

An improved seal for electronic components is disclosed, having a hydrophobic, microporous membrane sealed about a housing aperture to provide substantial internal to external pressure equalization during temperature and pressure variations encountered during the solder and cleaning process, while substantially sealing the housing aperture from damaging amounts of external contaminating fluids.

The microporous membrane may be secured to a nonporous tape about a tape aperture, and the tape may be secured to the electronic component housing about the housing aperture; or the microporous membrane may be secured directly to the housing about the housing aperture.

The hydrophobic, microporous membrane may be permanently sealed to the electronic component housing about the housing aperture; or the microporous membrane may be removed after the solder and cleaning process is completed. A tab portion may be secured to the microporous membrane for ease of removal.

17 Claims, 3 Drawing Sheets

METHOD OF MAKING VENTED SEAL FOR ELECTRONIC COMPONENTS AND AN ENVIRONMENTALLY PROTECTED COMPONENT

TECHNICAL FIELD

The present invention relates to an improved method and apparatus for sealing electronic components, and more particularly to vented seals for sealing electronic components from external contamination during changes in temperature and pressure.

BACKGROUND ART

Many electronic components, particularly electromechanical components, require an internal air space or chamber within the electrical component to allow for internal movement of the component's parts. Many of these electronic components are designed for securement to a circuit board, in order to perform their desired function.

Typically, these electronic components are secured to circuit paths on the circuit board by soldering. The soldering process is often automated for speed, uniform quality and production efficiency.

A number of in-line, automated solder processes, such as wave, vapor-phase and infrared solder processes are known to the art. Such processes often include a solder flux preparation prior to soldering to improve the bond integrity of the soldered connection. The solder flux is typically highly reactive with the materials to be soldered, in order to remove oxides from the materials prior to soldering.

The solder flux must be removed soon after soldering to prevent further corrosion to the electronic leads. This is usually accomplished by cleaning the soldered circuit board soon after soldering. Cleaning solvents and fluids are often used to remove flux from the circuit board.

The flux, cleaning solvents and fluids can severely damage the internal elements mounted within the electronic component housing. To prevent entry of external contamination some electronic components, such as semiconductor and vacuum components, are hermetically sealed.

Many electronic components do not require a hermetically sealed enclosure; or are not easily hermetically sealed due to external positioning of mechanical elements extending through the component housing. Exposure to corrosive elements during the flux, solder and cleaning process can seriously damage these electronic components, causing premature failure of the electronic component.

To prevent entry of external contamination during the flux, solder and cleaning process, it is known in the art to temporarily seal the housing aperture with a nonporous tape. This is only partially effective, as the adhesive used to seal the nonporous tape is weakened by the solvents used, and the temperature variations cause internal to external pressure differentials which act to separate a portion of the adhesive tape in proximity to the housing aperture, leaving a path for external contamination to enter within the component housing. Some electronic components have mechanical elements extending partially through the housing aperture which make these electronic components difficult to seal. Other electronic components, not having mechanical elements extending through the housing, are also susceptible to damage caused by internal to external pressure differentials acting on their sealing materials.

DISCLOSURE OF THE INVENTION

Therefore, what is needed is an economical vented seal for electronic components. The vented seal may be removed after the flux, solder and cleaning process or may be permanently secured to the housing to provide a venting seal to relieve internal pressure caused by temperature and pressure variations.

The present invention discloses a hydrophobic, microporous membrane, secured to the component housing about the housing aperture to effectively seal the electronic component during the flux, solder and cleaning process. The membrane allows a near equalization of internal to external pressure due to atmospheric or temperature variations. The hydrophobic, microporous membrane readily allows passage of air through the membrane to relieve internal pressure while inhibiting the passage of contaminating liquids into the electronic component.

The features and objects of this invention and the manner of attaining them will be best understood by reference to the following description of an embodiment of the invention, when considered in conjunction with the accompanying drawings.

BEST MODE FOR CARRYING OUT THE INVENTION

Figure 1:
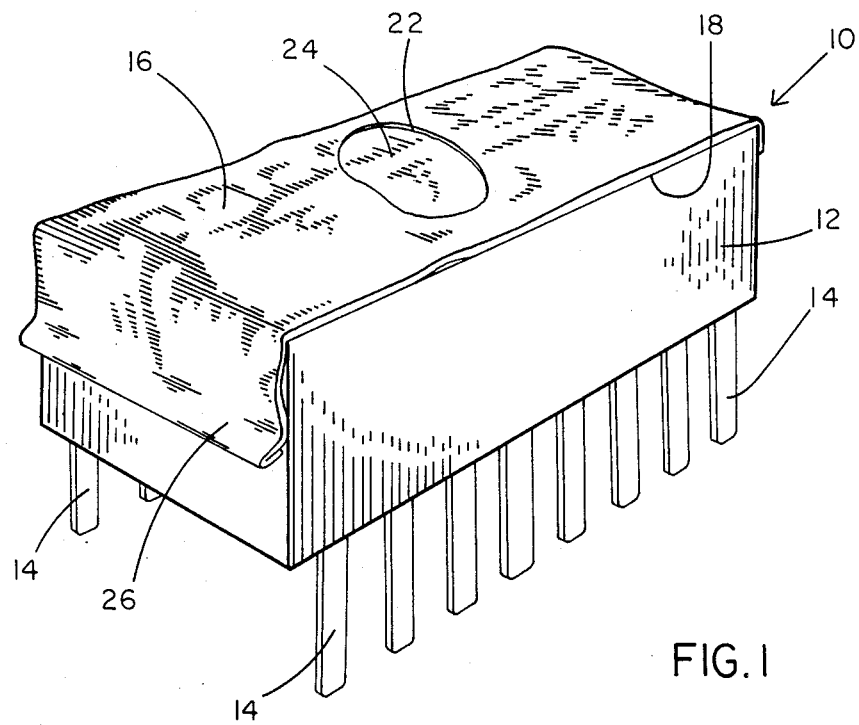
FIG. 1 is a perspective view of an electronic component switch with a vented seal installed over the housing aperture.

The subject matter which I regard as my invention is particularly pointed out and distinctly claimed in the claims. The structure and operation of my invention, together with further objects and advantages, may be better understood from the following description given in connection with the accompanying drawings, in which:

FIG. 1 discloses an electronic component 10, such as a DIP (Dual Inline Package) switch, in perspective view. Other electronic components 10, such as switches, relays, potentiometers, connectors, circuit breakers, thermostats, delay lines, coils, and other passive or electromechanical components are intended to fall within the scope of this invention. The electronic component 10 typically has a housing 12, through which a plurality of electrical connections 14 extend. As shown in FIG. 1, a nonporous tape 16 is sealed to the housing 12 with sealing means 18. The sealing means 18 may be any commercially available sealing means, including but not limited to, a pressure sensitive adhesive; a radiation curable adhesive; a temperature cured adhesive; a multi-component adhesive; or by other conventional sealing means known to the art; such as ultrasonic welding, compression or heat forming. The sealing means 18 may be pre-applied to the housing 12 about aperture 20, or may be selectively applied to the tape prior to assembly. The sealing means 18 may also be disposed between the tape and the housing at assembly, and cured in a manner to effectively seal the housing aperture 20. At least a portion of the microporous membrance 24 should not be coated with adhesive to allow the microporous membrane to breathe. A microporous adhesive may also be used.

Preferably, the sealing means 18 will withstand temperatures from −40° C. to 176° C. (−40° F. to +350° F.). Lower temperatures are often encountered during shipping or storage in inclement weather, whereas higher temperatures are encountered during the soldering process.

Figures 2A, 2B:
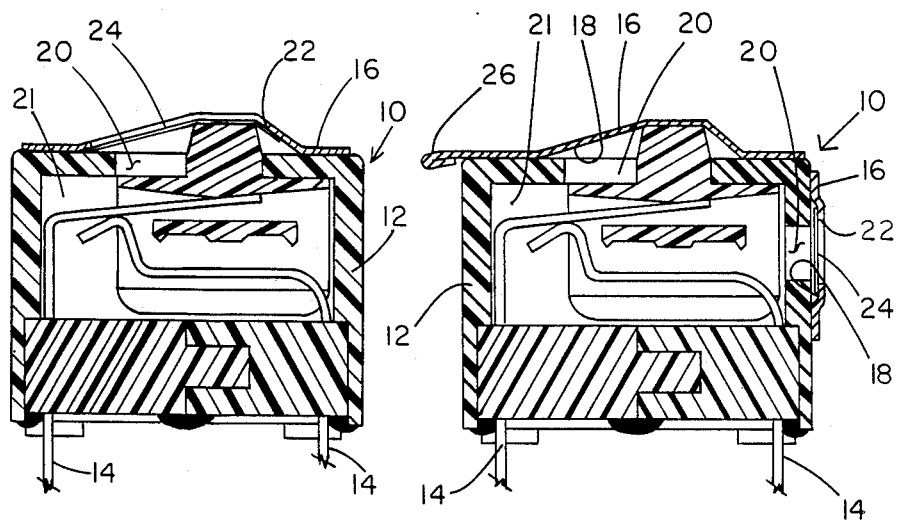
FIG. 2A is a cross sectional view of an electronic component showing a removable vented seal installed over the switch controls.
FIG. 2B is a cross sectional view of an electronic component showing a removable nonporous seal extending over the switch controls, with a permanent vented seal covering an aperture through a housing wall.

Nonporous tape 16 may be secured to housing 12 about aperture 20, shown in FIG. 2A or 2B, to seal aperture 20 against external contamination. A tape aperture 22 is aligned adjacent to housing aperture 20, and sealed with a hydrophobic, microporous membrane 24, which is commercially supplied by such sources as the Questar Division of Hoechst Celanese Corporation, Charlotte, North Carolina; or from Filtration Products Division of W. L. Gore & Associates, Inc., Elkton, Md. Alternately, a hydrophobic microporous membrane 24 may be sized to cover and seal the entire housing aperture 20, eliminating the need for non-porous tape 16.

A gasket or O-ring 19 may be used to seal the microporous membrane 24 about the housing aperture 20. The relay shown in FIG. 3 utilizes an unformed hold-down lip 13 (shown unformed) which is formed against the microporous membrane 24 about aperture 20 by heat forming. The formed lip 15 compresses gasket or O-ring 19 against housing 12 to effectively permanently seal chamber 21 of electronic component 10 with a microporous membrane 24. The gasket or O-ring will not be required if the heat forming creates an effective liquid seal between the microporous membrane 24 and housing 12 about housing aperture 20. This means provides continuous protection against liquid and particulate contamination, throughout useful life of the electronic component.

Microporous membranes have been commercially available for more than ten years. They have been commercially used for filtration, separation, venting and sensing equipment, but their use as a pressure equalizing seal for electronic components particularly during the flux, solder and cleaning process has not been previously known or used, to the best knowledge of the inventor.

The unexpected advantages of using a hydrophobic, microporous membrane as a venting seal for electronic components, will become apparent from the following description of the invention disclosed in the drawings, specification and claims. The temperatures and pressures referenced herein are representative of one flux-solder-cleaning process, and may vary with other equipment. Therefore, these temperatures and pressures are illustrative of the process and are not intended to limit the scope of the disclosed invention.

The manufacture and assembly of electronic components is typically accomplished at room temperatures of +18° C. to +29° C. (65° F. to 85° F.). A non-venting seal to protect the electronic component 10 housing chamber 21 is often installed at assembly, or prior to shipping the assembled part, at similar temperatures.

Depending upon the weather conditions, or the method of shipping, temperatures of −40° C. to +71° C. (−40° F. to +160° F.), and an atmospheric pressure of 4 or 5 psi (absolute) can result in up to +10 psi internal component pressure during air transport for several hours duration.

Storage, if required, may be in a non-heated or non-air conditioned environment, for days, weeks or even months. The circuit board assembler will typically install the electronic components 10 upon a circuit board 28 at room temperature of about +18° C. to +29° C. (65° F. to 85° F.).

Figure 4:
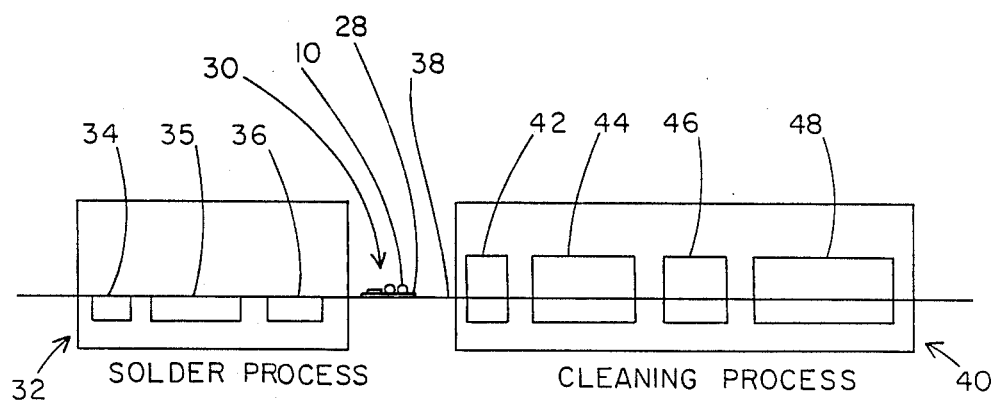
FIG. 4 is a diagram of a typical flux-solder-cleaning process used to solder electronic components to a circuit board.

The assembled circuit board 30 is then typically placed upon conveyerized, in-line soldering equipment 32 shown in FIG. 4. Flux 34 is applied to the circuit board assembly 30 at +18° C. to +29° C. (65° F. to 85° F.). The circuit board assembly 30 is then preheated 35 to about +93° C. (200° F.), for approximately one minute. This results in an increase of internal cavity pressure within housing 12, relative to ambient pressure of approximately +1 psi.

The next process step 36 includes applying solder to the bottom of the circuit board assembly 30. This raises the circuit board temperature to approximately 176° C. to +260° C. (350° F. to 500° F.) for approximately three seconds, which raises the resulting cavity pressure within housing 12 to approximately +2 psi.

The circuit board assembly 30 then passes along a transport conveyer 38 at about +32° C. (+90° F.) for approximately one minute, with internal cavity pressure decreasing towards zero psi. Next, the circuit board assembly 30 passes through an automated cleaning equipment cycle 40, which includes pre-washing 42 with a liquid such as water at approximately 32° C. (90° F.). The pre-wash is typically followed by a spray wash 44 at approximately +71° C. (160° F.) for approximately one minute, which raises internal cavity pressure to approximately +1 psi. If the adhesive seal leaks, the pressure within the housing 12 will return to ambient atmospheric pressure.

After washing, the circuit board assembly passes through a final rinse 46 at +18° C. to +29° C. (65° F. to 85° F.) for approximately one minute. This can create a negative pressure in the internal cavity of housing 12, if the seal leaked or ruptured during the wash cycle, and then reseals at lower temperatures. Cleaning solvents and liquids may be used during the cleaning cycle to ensure removal of all flux 34. The circuit board assembly then typically passes through a drying process 48 at approximately +93° C. (200° F.) for approximately 15 minutes. During the drying process, the internal cavity pressure returns to approximately +1 psi.

The circuit board assembly 30 is then typically assembled into a selected electronic component system (not shown), and shipped to a distributor, dealer, or end user. Shipping temperatures may vary from −28° C. to +74° C. (−20° F. to +165° F.), as previously noted.

Figure 5:
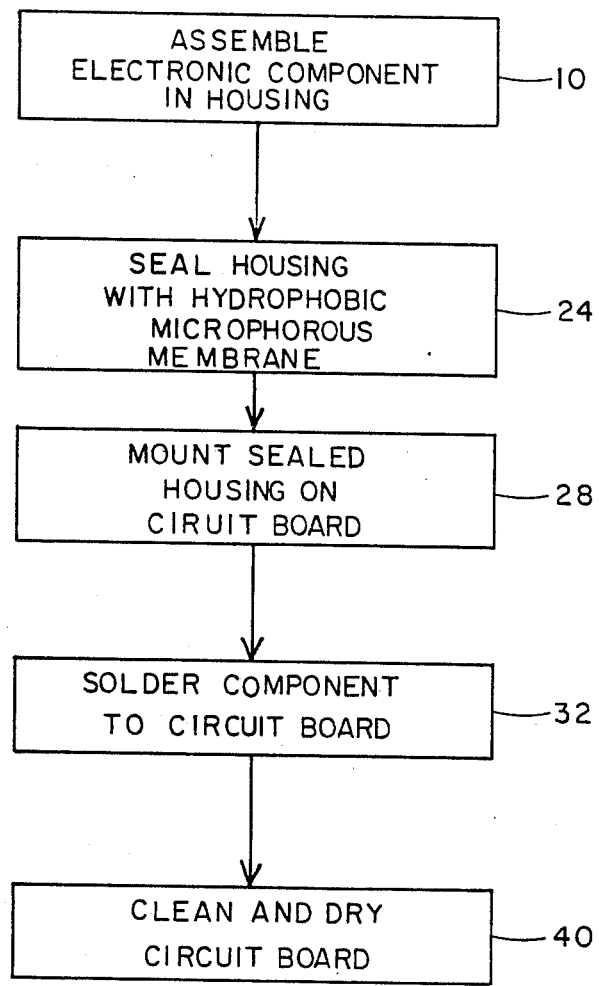
FIG. 5 is a diagram of the preferred vented seal process steps.

The heat processing steps shown in FIG. 5 cause an internal pressure build up within sealed electronic component 10. This pressure may vent to atmosphere, causing a passage between internal chamber 21 and atmosphere. Temperature rapidly drops during the final rinse 46, creating a partial vacuum within leaking tape sealed electronic component 10. The partial vacuum may draw rinse solutions and other contaminating material inside the housing 12 via any passage caused by the earlier vented pressure, which may severely damage the electrical component 10.

With the requirement for high quality and reliability in electronic components made for today's complex electronic systems, seal reliability becomes a critical factor. The ever decreasing electronic component 10 size, and the physical factors that act to break seal integrity during the shipping or flux-solder-cleaning process, require a seal that is inexpensive and easy to apply, while providing reliable protection against external contamination.

Non-porous tape 16 is often secured about the housing aperture 20 with sealants, potting, O-rings, films or tapes. All of these sealing means are subject to the potentially damaging effect of internal cavity vacuum and pressure. The hydrophobic, microporous membrane 24 disclosed herein relieves internal cavity pressure caused by temperature and pressure variations, making these conventional sealing means reliable to use. Therefore, the previously mentioned sealing means are intended to fall within the scope of the sealing means 18 disclosed herein.

Figure 3:
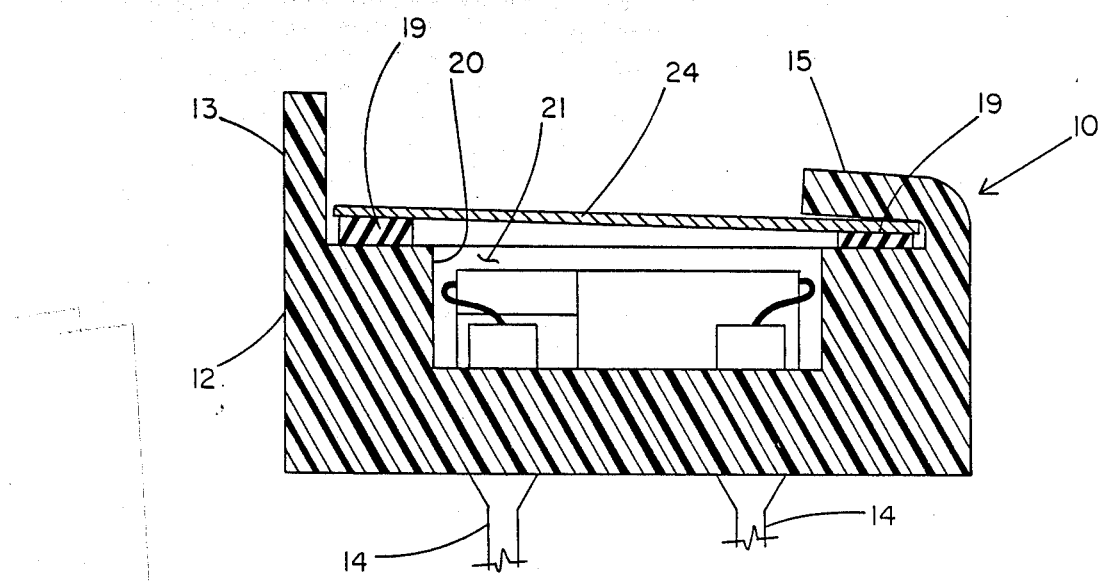
FIG. 3 is a cross sectional view of an electronic component having a microporous membrane sealed about a housing aperture by heat forming.

The microporous membrane 24 may be adapted to seal a small aperture 22 in a non-porous tape 16 as shown in FIG. 2A, or the microporous membrane 24 may be adapted to cover the entire housing aperture 20 as shown in FIG. 3. The sealing means 18 may be directly applied to the microporous membrane 24, for securement to the housing about the housing aperture. The microporous membrane 24 or the non-porous tape 16 supporting the microporous membrane 24 is preferably secured to the housing 12 after assembly of the electronic component 10.

Where a removable seal is desired, a tab 26 may be secured to the non-porous tape 16 or to the microporous membrane 24 for ease of removal after the flux-solder-cleaning process is completed. Tab 26 may be simply made by bending the adhesive portion of the tape 16 upon itself as shown in FIG. 1 or FIG. 2B, or by other ways practiced in the art.

Where a permanent microporous membrane 24 is desired, a separate aperture 20 may be provided at a remote location in the housing 12, as shown in FIG. 2B. It is well within the scope of this invention to provide either a permanent or temporary microporous membrane 24 as disclosed herein.

FIG. 5 discloses the preferred processing steps for utilizing this invention.

The electrical component 10 is first assembled within housing 12. A microporous membrane 24 is used to seal the housing aperture 20. Alternatively, the microporous membrane 24 may be secured about an aperture 22 in a nonporous tape 16, and the nonporous tape 16 secured about the housing aperture.

The sealed electronic component 10 is then positioned upon a circuit board 28, and placed upon a conveyer 38 for processing through in-line soldering equipment 32. In-line soldering equipment 32 typically includes the application of a suitable flux 34, such as a foaming organic acid flux. The flux is directed towards the underside of circuit board assembly 30. Next, the circuit board assembly 30 passes through a preheat cycle 35, and then through a wave solder cycle 36.

The soldered circuit board assembly 30 then passes through an automated cleaning and drying process 40 which comprises a pre-wash 42, followed by a spray wash 44 at higher temperatures; a final rinse 46, (usually with tap water); and a drying process 48. The wash process 40 may include cleaning solvents or solutions which are damaging to the internal elements of the electronic components 10.

After drying, the temporary microporous membrane 24 shown in FIG. 1 and 2A may be removed, whereas the permanent microporous membrane 24 shown in FIG. 2B and FIG. 3 may remain in place. As shown in FIG. 2B, a temporary nonporous tape 16 may be used in conjunction with a permanent microporous membrane 24. The microporous membrane 24 may extend across the entire housing aperture as shown in FIG. 3, or may cover a much smaller area as shown in FIGS. 1 and 2B.

Tests conducted with a microporous membrane having a porosity of 45 percent and an air flow rate of 118 cubic inches per square inch of membrane per minute at a pressure of 76 centimeters of mercury show a preferred aperture size of not less than 0.01 square inches in cross sectional area. When less porous membranes are used, the cross sectional area of the microporous membrane 24 should increase, to provide similar results.

The hydrophobic, microporous membrane 24 disclosed herein is intended to be selected on the basis of a high gas flow rate and a low liquid flow rate. The high gas flow rate must be sufficiently high to allow internal pressure within electronic component 10 to vent to the surrounding atmosphere during the rapid process temperature changes. The low liquid flow rate must be sufficient to prevent entry of damaging amounts of contaminating fluid through membrane 24 into the electronic component chamber 21 during the soldering 32 an cleaning process 40.

For best results, the hydrophobic, microporous membrane 24 should have a pore size of 0.1 micrometers or less, while exhibiting a critical surface tension of less than the critical surface tension of water, which is 70 dynes/cm. Tests with hydrophobic, microporous membranes 24 having a pore size of less than 0.1 micrometers, and a critical surface tension of approximately 35 dynes/cm have been found to be effective at venting internal pressure while sealing the electronic component chamber 21 from contaminating fluids during the solder 32 and cleaning process 40.

Therefore, while this invention has been described with reference to a particular embodiment, it is to be understood that modifications may be made without departing from the spirit of the invention or from the scope of the following claims.

INDUSTRIAL APPLICABILITY

This invention discloses a microporous membrane for providing a vented seal to protect electronic components from external contamination during temperature and pressure variations.

What is claimed is:

1. An improved process for sealing an electronic component having a housing with an aperture therein, and a chamber in communication with the housing aperture, and a conductive portion extending through the housing, which comprises:
   a. assembling the electronic component substantially within the housing chamber;
   b. sealing the housing aperture with a hydrophobic, micro-porous membrane secured to the housing about the housing aperture;
   c. positioning the assembled and sealed electronic component upon a circuit board having at least one conductive path thereon;

d. soldering the conductive portion of the housing to at least one conductive path on the circuit board; and e. cleaning the assembled circuit board with a liquid that is substantially impervious to the hydrophobic, micro-porous membrane;

wherein the hydrophobic, micro-porous membrane provides substantial pressure equalization between the housing chamber and the surrounding environment during temperature and pressure variations, while substantially sealing the housing chamber from damaging amounts of contaminating fluids.

2. The process of claim 1, wherein the membrane remains substantially secured to the housing over a minimum temperature range of from minus 40° centigrade to plus 80 degrees centigrade.

3. The process of claim 1, wherein a sealing means is applied to the outer boundary of the membrane prior to securing the membrane to the housing.

4. The process of claim 1, wherein a sealing means is applied to the housing about the housing aperture prior to securing the membrane to the housing.

5. The process of claim 1, wherein the membrane is removed from the housing after the electronic component has been soldered to a circuit board and cleaned with a liquid that is substantially impervious to the membrane.

6. The process of claim 5, wherein a tab portion is secured to the membrane for ease of removal of the membrane from the housing.

7. The process of claim 1, wherein the housing aperture is
sealed with a nonporous tape, having a tape aperture therethrough, and the microporous membrane is secured to the nonporous tape about the tape aperture.

8. The method of claim 7, wherein the membrane is removed from the housing after the electronic component is soldered to a circuit board and cleaned with a liquid that is substantially impervious to the membrane.

9. The method of claim 8, wherein a portion of the tape extends beyond the housing aperture to provide a tab portion for ease of removal of the membrane from the housing.

10. A method for sealing an electronic component having a housing with a housing aperture therein and a chamber in communication with the housing aperture, which comprises:

a. assembling the electronic component substantially within the housing chamber in preparation for securement of the component to a circuit board;

b. supplying a tape of an overall size greater than the overall size of the housing aperture, the tape of a type substantially impervious to external contamination during soldering and subsequent cleaning;

c. coating one side of the tape with an adhesive means suitable for securing the tape to the housing over a minimum temperature range of minus 40° C. to plus 80° C.;

d. securing a hydrophobic, micro-porous membrane of an overall size greater than the overall size of the tape aperture, and less than the overall size of the tape, to seal the membrane to the tape about the tape aperture;

e. securing the adhesive side of the tape to the component housing about the housing aperture, to provide substantial pressure equalization between the housing chamber and the surrounding environment during temperature and pressure variations, while substantially sealing the housing chamber from damaging amounts of external contaminating fluids.

11. The method of claim 10, wherein the tape aperture preferably has a cross sectional area greater than 0.01 square inches.

12. The method of claim 10, wherein the adhesive used to secure the tape to the housing is a pressure sensitive adhesive.

13. An environmentally protected electrical component comprising
a substantially enclosed chamber containing at least a portion of an electrical device means and a quantity of gaseous matter,
a selectively permeable means which allows relatively unimpeded transfer of gaseous matter and which is relatively impermeable to a first liquid means for cleaning and to solid matter, said selectively permeable means operatively interconnected to said chamber to allow passage of gaseous matter between said chamber and a region exterior to said chamber to yield gaseous pressure equalization therebetween,
whereby said selectively permeable means operatively prevents both said first liquid means for cleaning and solid matter from significant infiltration into said chamber.

14. The environmentally protected electrical component of claim 13 further comprising an adhesive means disposed about said selectively permeable means and located in operative alignment with an aperture in said chamber for performing said operative interconnection.

15. The environmentally protected electrical component of claim 13 further comprising a removal means operatively connected to said selectively permeable means for enhancing ease of elimination of said operative interconnection.

16. The environmentally protected electrical component of claim 14 wherein said selectively permeable means comprises a hydrophobic microporous membrane.

17. The environmentally protected electrical component of claim 16 wherein said adhesive means is further comprised by an adhesive tape.

* * * * *